(12) United States Patent
Lien

(10) Patent No.: US 7,119,436 B2
(45) Date of Patent: Oct. 10, 2006

(54) MEMORY MODULE

(75) Inventor: Shih-Hsiung Lien, Taipei (TW)

(73) Assignee: Optimum Care International Tech. Inc., Taipei (TW)

( * ) Notice: Subject to any disclaimer, the term of this patent is extended or adjusted under 35 U.S.C. 154(b) by 8 days.

(21) Appl. No.: 10/998,312

(22) Filed: Nov. 26, 2004

(65) Prior Publication Data

US 2005/0127368 A1 Jun. 16, 2005

(30) Foreign Application Priority Data

Nov. 27, 2003 (TW) .............................. 92221015 U

(51) Int. Cl.
*H01L 23/02* (2006.01)
*H01L 23/48* (2006.01)
*H01L 23/34* (2006.01)

(52) U.S. Cl. ...................... 257/723; 257/685; 257/686; 257/678; 257/724

(58) Field of Classification Search ................. 257/685, 257/686, 723, 724, 678, 777, E25.005, E25.006, 257/E25.021, E25.027, E23.085
See application file for complete search history.

(56) References Cited

U.S. PATENT DOCUMENTS 5,497,027 A * 3/1996 Crafts .................... 257/528
6,911,730 B1 * 6/2005 New .......................... 257/724
2001/0053565 A1 * 12/2001 Khoury ...................... 438/121

FOREIGN PATENT DOCUMENTS

JP 3-105953 * 5/1991 ................. 257/723

* cited by examiner

*Primary Examiner*—Jasmine Clark

(57) ABSTRACT

The memory module includes a plurality of memory units, each of which include a memory substrate, at least a memory chip having a predetermined memory capacity mounted on the memory substrate, and a conductive terminal provided at a lower edge portion of the memory substrate to electrically connect with the memory chip. An assembling arrangement includes a first joint provided at a side edge of each of the memory substrates and a second joint provided at an opposed side edge of each of the memory substrates, wherein the first joint of the memory unit is detachably engaged with the second joint of the adjacent memory unit to alignedly couple the memory units with each other in an edge to edge manner, such that the memory units form the memory module.

20 Claims, 3 Drawing Sheets

MEMORY MODULE

BACKGROUND OF THE PRESENT INVENTION

1. Field of Invention

The present invention relates to a memory device, and more particularly to a plurality of memory units interconnecting with each other to form an elongated memory plate so as to substantially reduce the checking and repairing time as well as save the overall costs of memory module production.

2. Description of Related Arts

Memory device is a kind of standardized component widely used in electrical products such as desktop computers, laptop computers, industrial computers, and printers. Along with the advancing movement of the IT related technology, the world witnesses the memory capacity of the memory device have been volumetrically expanded and meanwhile, the retrieving speed from the memory device have been significantly reduced. However, the principle structure of the memory device has never been improved to comply with this dramatic change. Commonly, a conventional memory device comprises a unified substrate and a plurality of memory chips spacedly provided on the unified substrate. In case of the unified substrate is damaged, all memory chips, which are welded on the unified substrate, have to be detached from unified substrate first, and then be welded on a new substrate. On the other hand, if the memory chip is damaged, the above mentioned repairing procedure is followed too. Accordingly, the damaged memory chip must be detached from the unified substrate in order to replace a brand new memory chip thereon. As a result, this kind of time consuming and laborious reparation procedure virtually burdened the costs of memory device.

In addition, providing an efficient after-sales service is an advantageous business method in a highly competitive marketing environment today. It is unquestionable that a prolonged repairing period of memory device will be harmful to the service reputation of the manufactures among customers. What is more, the suppliers of the memory device have to maintain a quantity of memory module stock for potential reparations and exchanges from customers, therefore causing an unnecessary increase of the cost and some undesirable dead stock.

SUMMARY OF THE PRESENT INVENTION

A primary object of the present invention is to provide a memory module which is simply repairable and time-cost reducible. Whenever a substrate of such memory module is damaged or degraded, only a portion of damaged memory chips are needed to be detached from the substrate, instead of all memory chips being detached for reparation; further, if certain memory chips are damaged, the reparation could be exclusively focused on said damaged memory chips without interrupting the substrate and other memory chips so that maintenance and replacement of such memory module is simple, convenient, and timesaving.

Another object of the present invention is to provide a memory module which does not need a quantity of stocking parts for reserving and exchanging purposes so as to substantially reduce the costs.

Accordingly, to achieve above mentioned objects, the present invention provides a memory module which comprises a plurality of memory units, each of which comprises a memory substrate, at least a memory chip having a predetermined memory capacity mounted on the memory substrate; whenever for application, the user may interconnect the memory units to assemble an elongated memory member as the memory module, and then insert the elongated memory member into the memory slot of memory module adaptor for electrical communication.

Furthermore, the memory module comprises an assembling arrangement comprising a first joint and a second joint provided between any of two adjacent memory units wherein the first joint is provided at a side edge of each of the memory substrate and the second joint is provided at an opposed side edge of each of the memory substrates, the first joint is detachably engaged with the second joint of the adjacent memory unit to alignedly couple the memory units with each other in an edge to edge manner, such that the memory units form an elongated memory member as the memory module.

The first joint is a protruding member integrally protruded from the side edge of the memory substrate, and the second joint is a recessed slot which is shaped and sized matching with the protruding member and is indent from the opposed side edge of the memory substrate, such that when the protruding member is fittingly engaged with the recessing slot, the memory units are securely interlocked with each other.

These and other objectives, features, and advantages of the present invention will become apparent from the following detailed description, the accompanying drawings, and the appended claims.

DETAILED DESCRIPTION OF THE PREFERRED EMBODIMENT

Figure 1:
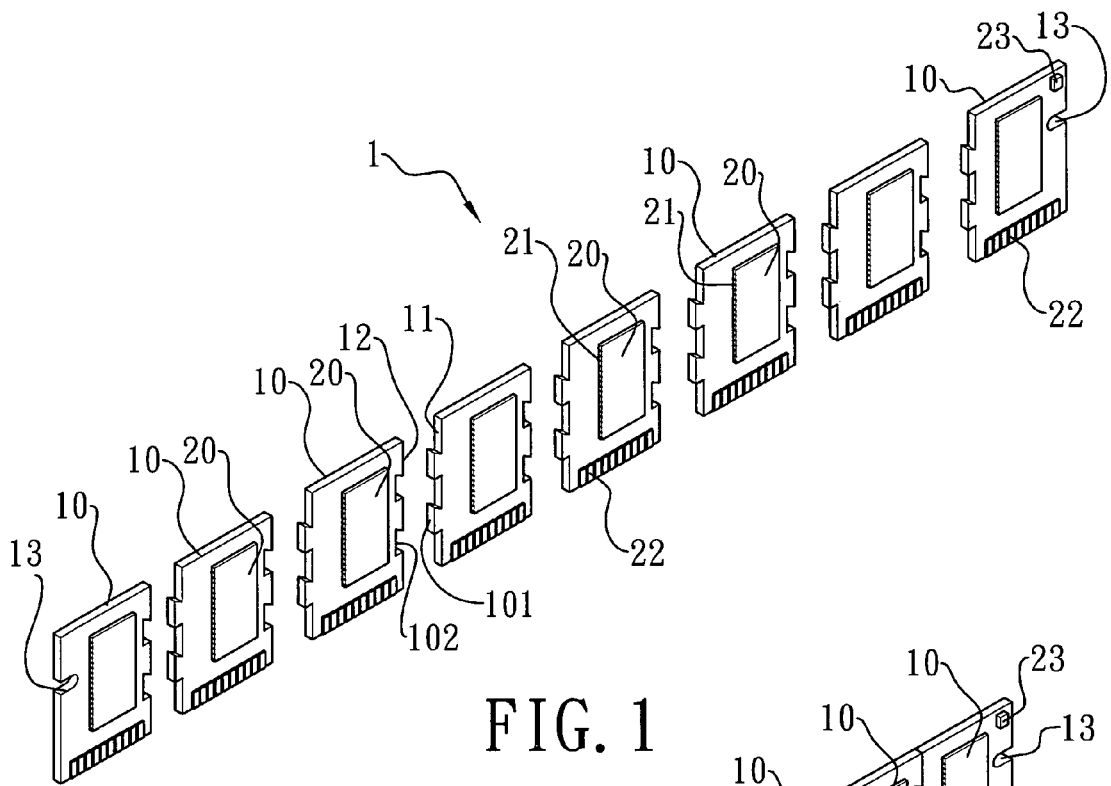
FIG. 1 is an exploded perspective view of a memory module according to a first preferred embodiment of the present invention.
Figure 2:
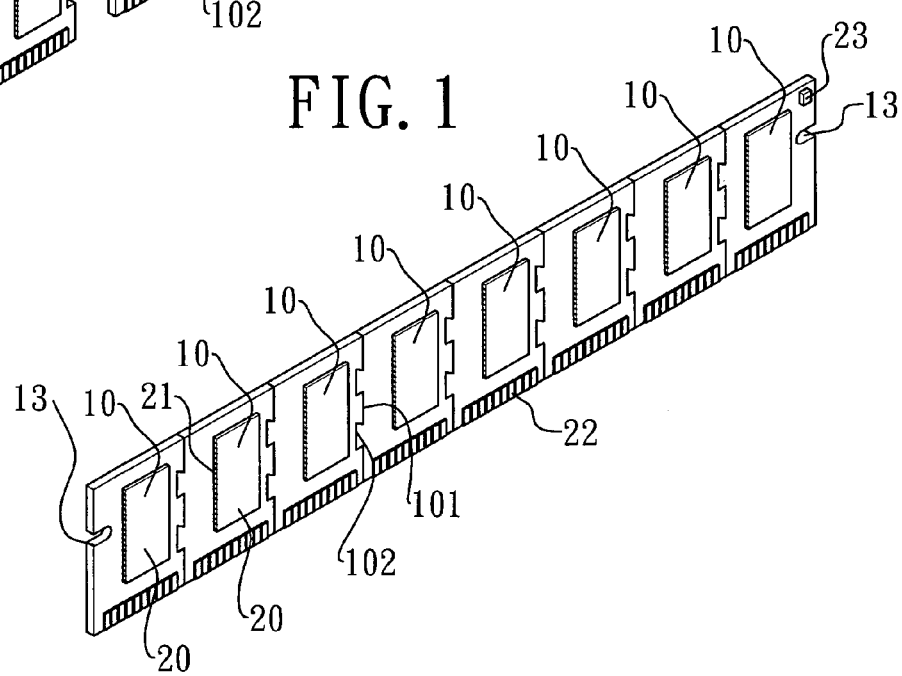
FIG. 2 is a perspective view of the memory module according to the above preferred embodiment of the present invention.
Figure 3:
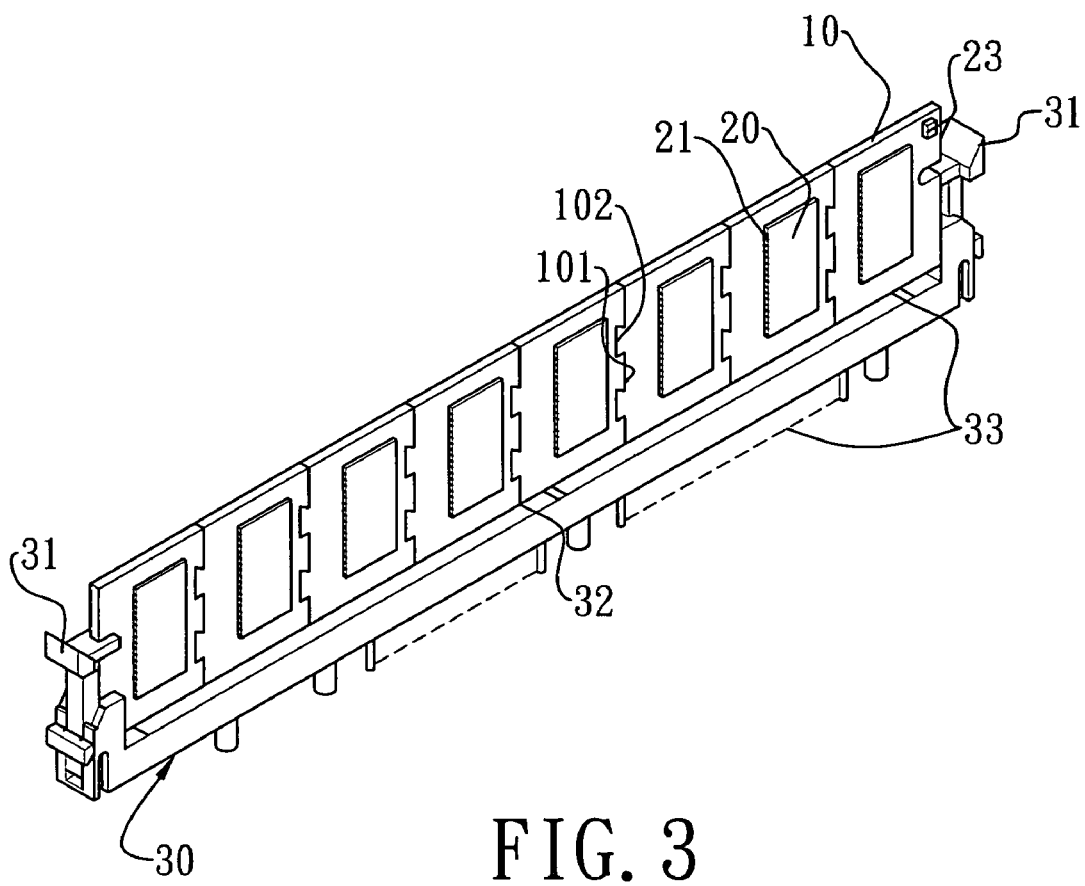
FIG. 3 is a perspective view of the memory module according to the above preferred embodiment of the present invention showing the memory module being inserted into a memory module adaptor.

Referring to FIGS. 1 to 3, a memory module 1 according to a preferred embodiment of the present invention is illustrated. The memory module 1 comprises a plurality of memory units, each of which comprises a memory substrate 10, at least a memory chip 20 having a predetermined memory capacity mounted on the memory substrate 10, and a conductive terminal 22 provided at a lower edge portion of the memory substrate 10 to electrically connect with the memory chip 20.

The memory module 1 further comprises an assembling arrangement comprising a first joint 101 provided at a side edge 11 of each of the memory substrates 10 and a second joint 102 provided at an opposed side edge 12 of each of the memory substrates 10, wherein the first joint 101 of the memory unit is detachably engaged with the second joint 102 of the adjacent memory unit to alignedly couple the memory units with each other in an edge to edge manner, such that the memory units form an elongated memory member as the memory module 1.

According to the preferred embodiment, the memory chips 20 has a plurality of electrical terminals 21 electrically extended on the memory substrate 10 to electrically communicate with the conductive terminal 22 for electrically connecting with a memory terminal 33 of a memory module adaptor 30.

Accordingly, the first joint 101 comprises a protruding member integrally protruded from the side edge 11 of the memory substrate 10 and the second joint 102 is a recessing slot which is shaped and sized matching with the protruding member of the first joint 101 and is indent from the opposed side edge 12 of the memory substrate 10, such that when the protruding member of the first joint 101 is fittingly engaged with the recessing slot of the second joint 102, the memory units are securely interlocked with each other. It is worth to mention that there are two first joints 101 spacedly extended from the side edge 11 of each of the memory substrates 10 to fittingly engage with two second joints 102 spacedly provided at the opposed side edge 12 of each of the memory substrates 10, so as to enhance the engagement between each two memory units.

Each of the protruding members of the first joint 101, having a dovetail-shape, has an enlarged head portion and a narrow neck portion sidewardly extended from the side edge 11 of the memory substrate 10 to the enlarged head portion such that when the protruding member of the first joint 101 is fittingly engaged with the recessing slot of the second joint 102, the enlarged head portion of the protruding member is interlocked with the recessing slot to retain the memory units in position. In other words, the recessing slot of the second joint 102 has a dovetail-shape which is sized and shaped matching with the dovetail-shaped protruding member of the first joint 101.

It is seen that when the memory units are interconnected to form the elongated memory member, two memory units positioned on the two outer sides of the elongated memory member are respectively embodied as two end units having different structures with other memory units of the elongated memory member. Each of the end units has a locking groove 13 formed on the respective edge thereof. Therefore, when the memory member is inserted into a memory slot 32 of a computer mother board 14, a locking arm 31 of the computer mother board 14 is adapted to engage with engage the said respective locking groove 13 so as to securely lock up the memory module along the memory slot 32 of a memory module adaptor 30 of the computer mother board 14.

That is to say the memory substrate 10 positioned on the one end of the elongated memory member of the memory module 1 only comprises the protruding member of the first joint 101 at one side edge 11 thereof, and correspondingly, the memory substrate 10 positioned on the opposed end of the elongated memory member of the memory module 1 only comprises the recessing member of the second joint 102 at the opposed side edge thereof 12 for engaging with the memory substrate 10 positioned next to two end units.

Moreover, an electrically erasable programmable read-only memory (EEPROM) 23 is provided at one of the memory nits, preferably the end unit, wherein the EEPROM 23 is mounted on the memory substrate 10 is electrically communicate with the memory chip 20 thereof for integrating and memorizing the information saved in all memory substrates 10 and memory chips 20. It is worth to mention that circuit of each memory substrate 10 could be individually reset according to the integral layout of the conventional unified substrate. As a result, the electrical communication between memory substrates 10 is bridged through the memory module adaptor 30. Alternatively, a leaf spring could be installed to each memory substrate 10 for serially and electrically connecting different memory substrates.

Figure 4:
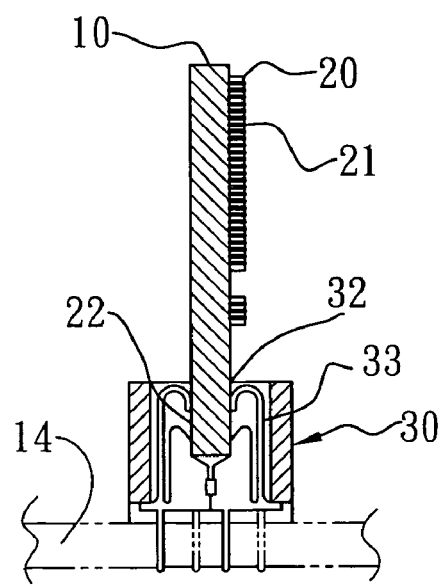
FIG. 4 is a sectional view of the memory module according to the above preferred embodiment of the present invention.

As shown in FIG. 2, the memory module 1 formed by interconnecting each memory substrate has an identical shape with the conventional unified substrate. So that the memory module 1 is capable of being inserted into the memory slot 32 provided on the memory module adaptor 30 as shown in FIG. 3. At the same time, the memory terminals 33 of the memory module adaptor 30 are connected with the circuit board 14 as shown in FIG. 4.

As described above, the memory module 1 according to the first preferred embodiment of the present invention comprises a plurality of memory substrates 10 alignedly and engagingly coupled to form the memory module 1 for applications. Thanks to its new structure of the memory module 1, the reparation procedure of such memory module is rather convenient and simple. If any memory chips 20 or memory substrates 10 are found degraded or damaged during a checking process, only that damaged or degraded memory substrates 10 will be changed instead of changing the whole substrate known in the conventional reparation process. Therefore, the reparation cost for the memory module of the present invention has been substantially reduced.

Since every two adjacent memory substrates 10 are engaged in an edge to edge manner, it is convenient to assemble the memory substrates 10 as well as the memory units together or detach one memory substrate 10 from another one thus reducing the reparation time.

Accordingly, each of the memory units has the same memory capacity, wherein the memory units are formed in pair. As shown FIGS. 1 to 3, there are four pairs of memory units, i.e. eight memory units, alignedly mounted together to form the memory member of the memory module.

Figure 5:
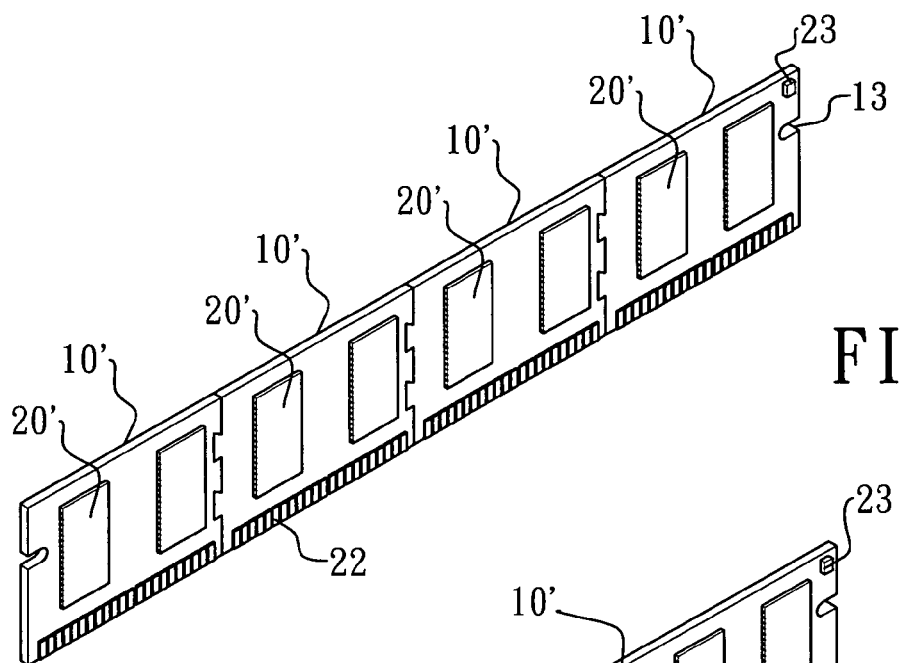
FIG. 5 illustrates a first alternative mode of the memory module according to the above preferred embodiment of the present invention.

Referring to the FIG. 5, the memory module according to the first alternative mode of the present invention is illustrated. The memory module is formed by interconnecting four memory substrates 10' together, wherein each of memory substrate 10' has two memory chips 20' provided thereon. It is noted that other structures of the first alternative mode are kept unchanged in comparison with the above described embodiment in the present invention to achieve the objectives.

Figure 6:
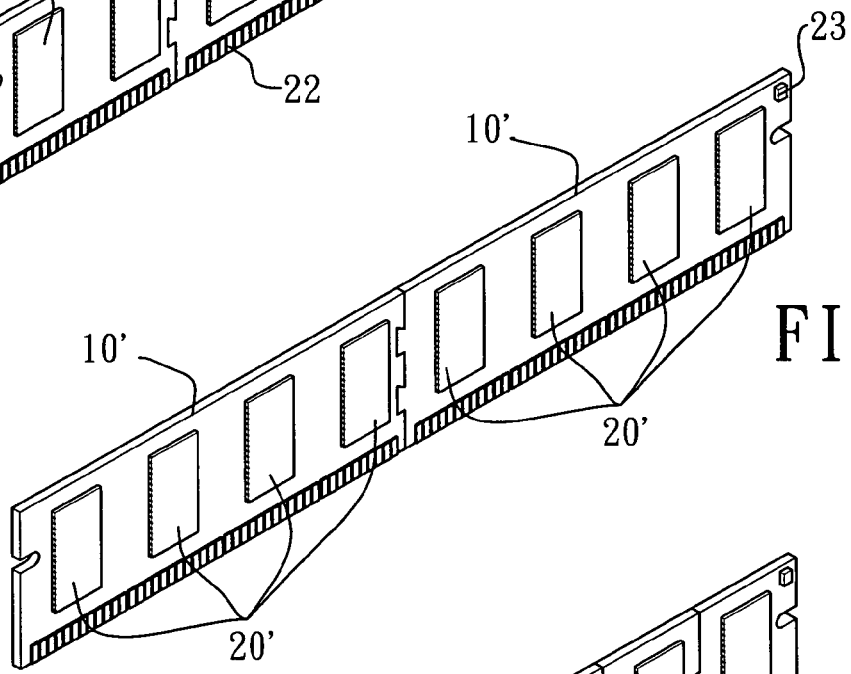
FIG. 6 illustrates a second alternative mode of the memory module according to the above preferred embodiment of the present invention.

Referring to the FIG. 6, the memory module according to the second alternative mode of the present invention is illustrated. The memory module is formed by interconnecting two memory substrates 10' together, wherein each of memory substrates 10' has four memory chips 20' provided thereon. It is noted that other structures of the second alternative mode are kept unchanged in comparison with the above described embodiment in the present invention to achieve the objectives.

Figure 7:
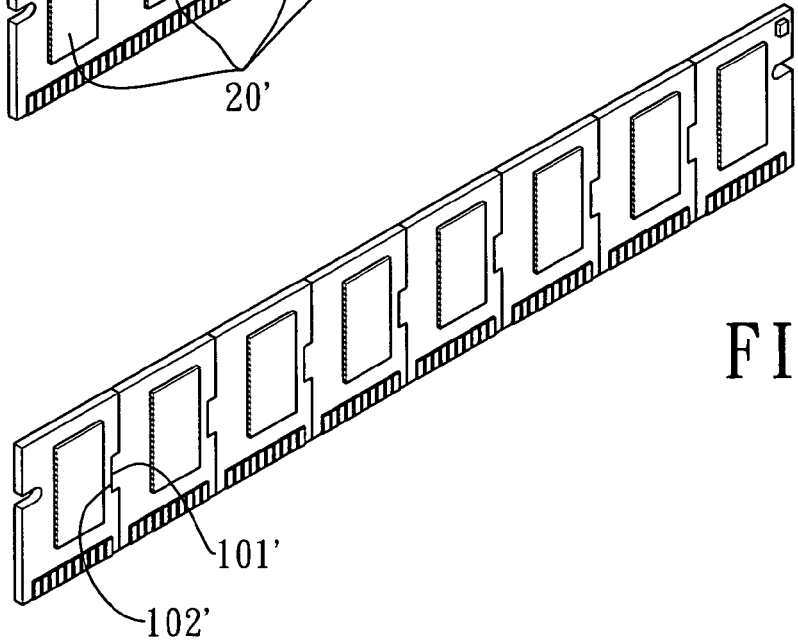
FIG. 7 illustrates a third alternative mode of the memory module according to the above preferred embodiment of the present invention.

FIG. 7 illustrates an alternative mode of the assembling arrangement of the memory module wherein there is a first joint 101' integrally extended from the side edge of the memory unit and a second joint provided at the opposed side edge of the memory unit. The shape and size of the first and second joints 101', 102' can be varied that the first joint 101' is shaped and sized to match with the second joint 102', such that when the first joint 101' is fittingly engaged with the second joint 102', the memory units are securely interlocked with each other. It is noted that other structures of the alternative mode are kept unchanged in comparison with the above described embodiment of the present invention to achieve the objectives.

One skilled in the art will understand that the embodiment of the present invention as shown in the drawings and described above is exemplary only and not intended to be limiting.

It will thus be seen that the objects of the present invention have been fully and effectively accomplished. It embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A memory module, comprising:
a plurality of memory units, each of which comprises a memory substrate, at least a memory chip having a predetermined memory capacity mounted on said memory substrate, and a conductive terminal provided at a lower edge portion of said memory substrate to electrically connect with said memory chip; and
an assembling arrangement comprising a first joint provided at a side edge of each of said memory substrates and a second joint provided at an opposed side edge of each of said memory substrates, wherein said first joint of said memory unit is detachably engaged with said second joint of said adjacent memory unit to alignedly couple said memory units with each other in an edge to edge manner, such that said memory units form said memory module.

2. The memory module, as recited in claim 1, wherein said first joint is a protruding member integrally protruded from said side edge of said memory substrate and said second joint is a recessing slot which is shaped and sized matching with said protruding member and is indent from said opposed side edge of said memory substrate, such that when said protruding member is fittingly engaged with said recessing slot, said memory units are securely interlocked with each other.

3. The memory module, as recited in claim 2, wherein each of said protruding members, having an enlarged head portion and a narrow neck portion, sidewardly extended from said side edge of said memory substrate, wherein when said protruding member is fittingly engaged with said recessing slot, said enlarged head portion of said protruding member is interlocked with said recessing slot to retain said memory units in position.

4. The memory module, as recited in claim 1, wherein two of said memory units respectively positioned at two outer sides of said memory member are embodied as two end units, wherein each of said end units has a locking groove formed on said respective edge thereof, thereby, when said memory module is inserted into a memory slot of a computer mother board, a locking arm of said computer mother board is adapted to engage with engage with said respective locking groove so as to securely lock up said memory module along said memory slot.

5. The memory module, as recited in claim 2, wherein two of said memory units respectively positioned at two outer sides of said memory member are embodied as two end units, wherein each of said end units has a locking groove formed on said respective edge thereof, thereby, when said memory module is inserted into a memory slot of a computer mother board, a locking arm of said computer mother board is adapted to engage with engage with said respective locking groove so as to securely lock up said memory module along said memory slot.

6. The memory module, as recited in claim 3, wherein two of said memory units respectively positioned at two outer sides of said memory member are embodied as two ends units, wherein each of said end units has a locking groove formed on said respective edge thereof, thereby, when said memory module is inserted into a memory slot of a computer mother board, a locking arm of said computer mother board is adapted to engage with engage with said respective locking groove so as to securely lock up said memory module along said memory slot.

7. The memory module, as recited in claim 1, wherein said memory units have the same memory capacities.

8. The memory module, as recited in claim 3, wherein said memory units have the same memory capacities.

9. The memory module, as recited in claim 4, said memory units have the same memory capacities.

10. The memory module, as recited in claim 6, said memory units have the same memory capacities.

11. The memory module, as recited in claim 1, further comprising an electrically erasable programmable read-only memory (EEPROM) provided on one of said memory units to electrically connected with said respective memory chip thereof.

12. The memory module, as recited in claim 3, further comprising an electrically erasable programmable read-only memory (EEPROM) provided on one of said memory units to electrically connect with said respective memory chip thereof.

13. The memory module, as recited in claim 6, further comprising an electrically erasable programmable read-only memory (EEPROM) provided on one of said memory units to electrically connect with said respective memory chip thereof.

14. The memory module, as recited in claim 10, further comprising an electrically erasable programmable read-only memory (EEPROM) provided on one of said memory units to electrically connect with said respective memory chip thereof.

15. The memory module, as recited in claim 1, wherein said memory units are formed in pair.

16. The memory module, as recited in claim 3, wherein said memory units are formed in pair.

17. The memory module, as recited in claim 4, wherein said memory units are formed in pair.

18. The memory module, as recited in claim 6, wherein said memory units are formed in pair.

19. The memory module, as recited in claim 10, wherein said memory units are formed in pair.

20. The memory module, as recited in claim 14, wherein said memory units are formed in pair.

* * * * *